(12) United States Patent
Oh et al.

(10) Patent No.: US 12,343,881 B2
(45) Date of Patent: Jul. 1, 2025

(54) EQUIPMENT FRONT END MODULE AND DESTRUCTIVE ANALYSIS AUTOMATION APPARATUS INCLUDING THE SAME

(71) Applicant: SAMSUNG ELECTRONICS CO., LTD., Suwon-si (KR)

(72) Inventors: Youn Gon Oh, Hwaseong-si (KR); Sae Yun Ko, Hwaseong-si (KR); Gil Ho Gu, Hwaseong-si (KR); Dong Su Kim, Incheon (KR); Ji Hun Kim, Uiwang-si (KR); Sang Hyuk Park, Yongin-si (KR); Eun Hee Lee, Hwaseong-si (KR); Ho Chan Lee, Seoul (KR); Seong Sil Jeong, Incheon (KR); Seong Pyo Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 650 days.

(21) Appl. No.: 17/711,261

(22) Filed: Apr. 1, 2022

(65) Prior Publication Data

US 2023/0107043 A1     Apr. 6, 2023

(30) Foreign Application Priority Data

Sep. 29, 2021    (KR) ........................ 10-2021-0128434

(51) Int. Cl.
    *B25J 9/16*           (2006.01)
    *G05B 19/418*      (2006.01)
                   (Continued)

(52) U.S. Cl.
    CPC ...... *B25J 9/1687* (2013.01); *G05B 19/41875* (2013.01); *H01L 21/67294* (2013.01);
                   (Continued)

(58) Field of Classification Search
    CPC .............. B25J 9/1687; H01L 21/67742; H01L 21/67736; H01L 21/67769; H01L 21/67294; H01L 21/67333; H01L 21/67766; H01L 21/68707; H01L 21/67733; H01L 21/67236;
                   (Continued)

(56) References Cited

U.S. PATENT DOCUMENTS 8,076,605 B2    12/2011   Bruland et al.
9,442,482 B2    9/2016    Miner et al.
               (Continued)

FOREIGN PATENT DOCUMENTS

KR     100737226 B1    7/2007
KR     101747756 B1    6/2017

*Primary Examiner* — Thomas Randazzo
(74) *Attorney, Agent, or Firm* — Sughrue Mion, PLLC

(57) ABSTRACT

Provided is an equipment front end module (EFEM) including a base configured to communicate with a processor, a tray port on the base, the tray port being configured to load a tray including a stub and a grid holder, a working robot configured to move in a direction on the base, and grasp and convey the stub in the tray and the grid holder in the tray, and a shuttle port on the base, the shuttle port including a first groove configured to fix the stub, and a second groove configured to fix the grid holder, wherein the working robot is further configured to convey the stub to the first groove and convey the grid holder to the second groove.

20 Claims, 25 Drawing Sheets

(51) Int. Cl.
*H01L 21/67* (2006.01)
*H01L 21/673* (2006.01)
*H01L 21/677* (2006.01)

(52) U.S. Cl.
CPC .. *H01L 21/67333* (2013.01); *H01L 21/67736* (2013.01); *H01L 21/67742* (2013.01); *H01L 21/67769* (2013.01); *G05B 2219/45031* (2013.01)

(58) Field of Classification Search
CPC ......... H01L 21/67775; H01L 21/67781; H01L 22/10; G05B 19/41875; G05B 2219/45031
See application file for complete search history.

(56) References Cited

U.S. PATENT DOCUMENTS

| | | |
|---|---|---|
| 9,984,904 B2 | 5/2018 | Nakaharada et al. |
| 10,133,264 B2 | 11/2018 | Lim |
| 2015/0071739 A1* | 3/2015 | Nakamura ........ H01L 21/67769 414/217.1 |
| 2016/0370797 A1 | 12/2016 | Azarya et al. |
| 2019/0019706 A1 | 1/2019 | Takusari et al. |
| 2021/0366753 A1* | 11/2021 | Bergantz ................ B65G 47/90 |

* cited by examiner

EQUIPMENT FRONT END MODULE AND DESTRUCTIVE ANALYSIS AUTOMATION APPARATUS INCLUDING THE SAME

CROSS-REFERENCE TO RELATED APPLICATION

This application claims priority to Korean Patent Application No. 10-2021-0128434 filed on Sep. 29, 2021 in the Korean Intellectual Property Office, the disclosure of which in its entirety is herein incorporated by reference.

BACKGROUND

1. Field

Embodiments of the present disclosure relate to an Equipment Front End Module (EFEM) relating to a transport and storage process automation of a wafer from FAB to FAB-OUT, a process definition of a destructive structure analysis method of the wafer, and an inter-process automation, and a destructive analysis automation apparatus including the same.

2. Description of Related Art

As semiconductor processes are gradually miniaturized, an aspect ratio of a semiconductor device is increasing. As the aspect ratio increases, the semiconductor processes is becoming more difficult. Therefore, a destructive analysis of the wafer for a mechanism analysis of the semiconductor processes also tends to increase.

However, related destructive analysis processes of the wafer have been performed manually from wafer input to sample fabrication and photographing/analysis. When the processes are performed manually, reliability problems on setting of a destructive analysis region, problems on damage to the region of interest due to manual work, and safety problems may occur. To automate a transportation process of a sample aid between analysis apparatuses and a storage process of the sample aid, a separate automated device that acts as an interface of the analysis apparatus may be required.

SUMMARY

One or more example embodiments provide an Equipment Front End Module (EFEM) having an improved efficiency and productivity.

One or more example embodiments also provide a destructive analysis automation apparatus having an improved efficiency and productivity.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of an example embodiment, there is provided an equipment front end module (EFEM) including a base configured to communicate with a processor, a tray port on the base, the tray port being configured to load a tray including a stub and a grid holder, a working robot configured to move in a direction on the base, and grasp and convey the stub in the tray and the grid holder in the tray, and a shuttle port on the base, the shuttle port including a first groove configured to fix the stub, and a second groove configured to fix the grid holder, wherein the working robot is further configured to convey the stub to the first groove and convey the grid holder to the second groove.

According to another aspect of an example embodiment, there is provided a destructive analysis automation apparatus including a main device configured to perform a semiconductor destructive analysis, and an equipment front end module (EFEM) which is connected to a side of the main device, wherein the EFEM includes a tray port configured to load a tray including a stub and a grid holder, a shuttle port configured to fix the stub and the grid holder, the shuttle port being loaded in the main device, and a working robot configured to convey the stub, the grid holder, and the shuttle port, wherein the working robot is further configured to grasp the stub in the tray and the grid holder in the tray and convey the stub and the grid holder to the shuttle port, and wherein the working robot is further configured to grasp the shuttle port and loads the shuttle port into the main device.

According to another aspect of an example embodiment, there is provided a destructive analysis automation apparatus including a first main device configured to perform a pre-processing to form test wafer pieces and store the test wafer pieces in a stub, a second main device configured to perform a sample fabrication to fabricate a test sample and store the test sample in a grid holder, a first equipment front end module (EFEM) on a side of the first main device, and a second EFEM provided on a side of the second main device, wherein the first EFEM includes a first tray port configured to load the tray including the stub, a first shuttle port configured to fix the stub, and a first working robot configured to convey the stub from the tray to the first shuttle port and convey the first shuttle port to the first main device, and wherein the second EFEM includes a second tray port configured to load a tray including the grid holder, a second shuttle port configured to fix the grid holder, and a second working robot configured to convey the grid holder from the tray to the second shuttle port, and convey the second shuttle port to the second main device.

BRIEF DESCRIPTION OF THE DRAWINGS

The above and/or other aspects and features of the present disclosure will become more apparent by describing in detail example embodiments thereof with reference to the attached drawings, in which.

DETAILED DESCRIPTION OF THE EMBODIMENTS

Hereinafter, embodiments will be explained in detail with reference to the accompanying drawings. Embodiments described herein are example embodiments, and the present disclosure is not limited thereto.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Hereinafter, an Equipment Front End Module (EFEM) according to embodiments, a destructive analysis automation apparatus including the same, and an operating method of the destructive analysis automation apparatus will be described referring to FIGS. 1 to 25.

Figure 1:
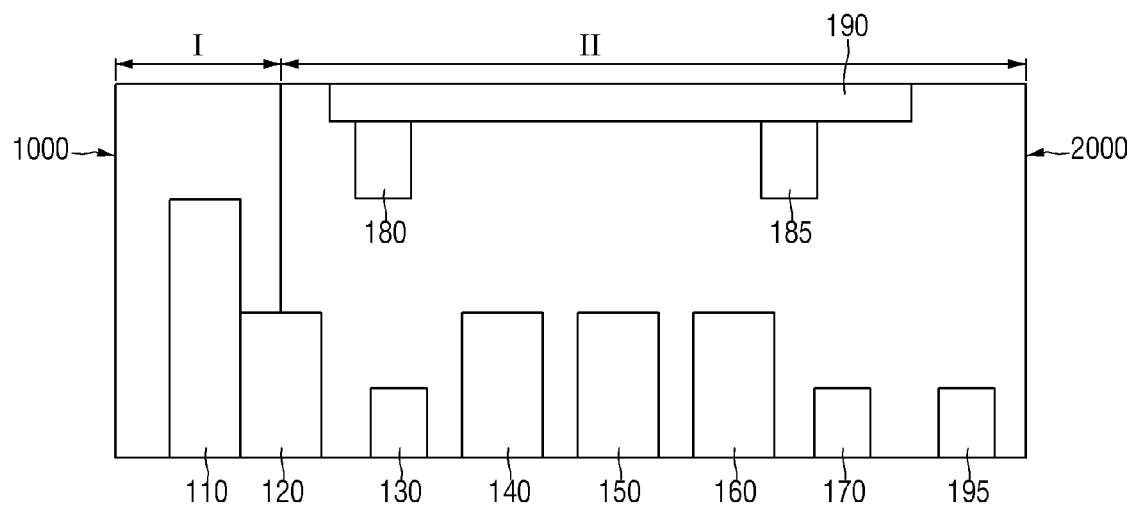
FIG. 1 is a conceptual diagram illustrating a destructive analysis automation apparatus according to embodiments.

FIG. 1 is a conceptual diagram illustrating a destructive analysis automation apparatus according to embodiments. Hereinafter, the destructive analysis automation apparatus will be described using FIG. 1.

Referring to FIG. 1, the destructive analysis automation apparatus according to embodiments includes a first region I and a second region II.

The first region I may be a region in which the semiconductor process is performed, and the second region II may be a region in which the semiconductor destructive analysis is performed. The first region I may be, for example, a process chamber 1000, and the second region II may be, for example, an analysis chamber 2000. The first region I may be a clean region. The second region II may be a non-clean region. Although the first region I and the second region II are shown as being adjacent to each other, embodiments are not limited thereto. The first region I and the second region II may be adjacent to each other or may be spaced apart from each other.

The destructive analysis automation apparatus according to embodiments may include an interlayer transport module 110, an exchange module 120, a wafer stocker 130, a pre-processing module 140, a sample fabrication module 150, an analysis module 160, a tray stocker 170, a front opening unified pod (FOUP) transfer module 180, a tray transfer module 185, a transfer rail 190, and a central module 195. The central module 195 may include an application specific integrated circuit (ASIC), a field-programmable gate array (FPGA), a dedicated microprocessor, a microprocessor, a general purpose processor, or the like.

The interlayer transport module 110 may be installed in the first region I. The interlayer transport module 110 may be installed inside the process chamber 1000. The interlayer transport module 110 may transfer or convey a first FOUP in a vertical direction. The first FOUP may be a space which stores a plurality of first wafers.

The interlayer transport module 110 may include a plurality of stages spaced in the vertical direction. The interlayer transport module 110 may convey the first FOUP to each stage. For example, when the interlayer transport module 110 includes a first stage and a second stage that are spaced apart from each other in the vertical direction, the interlayer transport module 110 may convey the first FOUP from the first stage to the second stage. Further, the interlayer transport module 110 may convey the first FOUP from the second stage to the first stage.

The exchange module 120 may be connected to the interlayer transport module 110. For example, the exchange module 120 may be directly connected to the interlayer transport module 110. The exchange module 120 may be provided at a boundary between the first region I and the second region II. The exchange module 120 may be provided at a boundary between the process chamber 1000 and the analysis chamber 2000. However, embodiments are not limited thereto.

The exchange module 120 may convey the first wafer inside the first region I to the second region II. The exchange module 120 may convey the first wafer inside the process chamber 1000 to the analysis chamber 2000. For example, the exchange module 120 may receive the first wafer from the interlayer transport module 110. The exchange module 120 may store the first wafer received from the interlayer transport module 110 in the second FOUP. The first FOUP may be a process chamber FOUP and the second FOUP may be an analysis chamber FOUP.

More specifically, the first FOUP conveyed from the interlayer transport module 110 may be loaded into the exchange module 120. The first wafer in the first FOUP may be unloaded from the first FOUP and loaded into the second FOUP. Information about the first wafer may be stored in a wafer ID. The wafer ID may be reported to a host system, for example, the central module 195 by a computer. The wafer ID may be tracked and controlled by the central module 195.

The wafer stocker 130 may be installed inside the second region II. The wafer stocker 130 may be installed inside the analysis chamber 2000. For example, the wafer stocker 130 may be installed on a bottom surface of the analysis chamber 2000. The wafer stocker 130 may informationize the first wafer. The wafer stocker 130 may informationize the first wafer to form a second wafer. For example, the informationized first wafer may be the second wafer.

As an example, the wafer stocker 100 may store the second wafer. Further, the wafer stocker 100 may discard a wafer (a disposal wafer) that remains after forming test wafer pieces (e.g., W of FIG. 5). As another example, the wafer stocker 100 may store the disposal wafer, and the stored disposal wafer may be reused later. The disposal wafer is stored for a preset period of time, and when the period of time elapses, the disposal wafer may be automatically transferred to a disposal box and discarded. Such a process may be reported to the central module 195 by a computer.

The pre-processing module 140 may be installed in the second region II. The pre-processing module 140 may be installed inside the analysis chamber 2000. For example, the pre-processing module 140 may be installed on the bottom surface of the analysis chamber 2000. The pre-processing module 140 may perform the pre-processing work. The pre-processing work may include formation of the test wafer piece W and formation of the disposal wafer.

For example, the pre-processing module 140 may form the test wafer pieces W and the disposal wafer, using the second wafer. Further, the pre-processing module 140 may generate a second ID including information about the test wafer pieces W. The ID may be stored in the tray ID and reported to the central module 195 by a computer. The test wafer pieces may be stored in a stub (S of FIG. 5). A plurality of test wafer pieces W may be informationized with different stub IDs from each other. Each stub ID may be tracked and controlled by the central module 195.

An EFEM may be installed on one side of the pre-processing module 140. The EFEM may be a space in which the second wafer loaded into the pre-processing module 140 or the tray (T of FIG. 4) unloaded from the pre-processing module 140 stays for a certain time. Details of the EFEM will be described later referring to FIGS. 3 to 10.

The sample fabrication module 150 may be installed inside the second region II. The sample fabrication module 150 may be installed inside the analysis chamber 2000. For example, the sample fabrication module 150 may be installed on the bottom surface of the analysis chamber 2000. The sample fabrication module 150 may fabricate a sample for testing the wafer. The test wafer pieces W may be loaded into the sample fabrication module 150. After that, the sample fabrication may be performed. When the sample fabrication is performed, the test sample may be fabricated. The test sample may be fabricated by cutting a part of the test wafer pieces W.

The test sample for which the work has been completed is fixed to a grid holder (GH of FIG. 6) and stored therein. A position fixed to the grid holder may be stored in a grid ID, and reported to the central module 195 by a computer. The grid holder GH is fixed to a tray T, and information about the test sample is stored in the tray ID assigned in advance.

An EFEM may be installed on one side of the sample fabrication module 150. The EFEM may be a space in which the tray loaded into the sample fabrication module 150 or the tray T unloaded from the sample fabrication module 150 stays for a certain time. Detailed contents of the EFEM will be described later using FIGS. 3 to 10.

The analysis module 160 may be installed inside the second region II. The analysis module 160 may be installed inside the analysis chamber 2000. For example, the analysis module 160 may be installed on the bottom surface of the analysis chamber 2000. The analysis module 160 may perform photographing/analysis on the test sample. The EFEM may also be installed on one side of the analysis module 160. However, embodiments are not limited thereto.

The tray stocker 170 may be installed inside the second region II. The tray stocker 170 may be installed inside the analysis chamber 2000. For example, the tray stocker 170 may be installed on the bottom surface of the analysis chamber 2000. The tray stocker 170 may informationize the tray. Further, the tray stocker 170 may store the tray T. The tray T may store the test wafer pieces W and the test sample. For example, the test wafer pieces W and the test sample may be placed in the tray T and conveyed, and may be stored in the tray T. The tray stocker 170 may automatically store the tray T loaded into the tray stocker 170.

The tray stocker 170 may generate a tray ID including information about the tray T. The tray ID may store a stub ID including information on the test wafer pieces W that are placed in the tray T, and a grid ID including information on the test sample. The IDs, for example, the tray ID, the stub ID, and the grid ID are reported to the central module 195 by a computer. The tray ID may be loaded with all kinds of information about the test wafer pieces W. The tray ID may be controlled by the central module 195. The tray ID may be used to track the history of future analysis processes.

The transfer rail 190 may be installed inside the second region II. The transfer rail 190 may be installed inside the analysis chamber 2000. The transfer rail 190 may be installed on a ceiling of the analysis chamber 2000. The wafer and the test wafer pieces W may be conveyed along the transfer rail 190.

The first wafer may be conveyed from the exchange module 120 to the wafer stocker 130 along the transfer rail 190. The second wafer may be conveyed from the wafer stocker 130 to the pre-processing module 140 along the transfer rail 190. The test wafer pieces W may be conveyed from the pre-processing module 140 to the sample fabrication module 150 along the transfer rail 190. The test sample may be conveyed from the sample fabrication module 150 to the analysis module 160 and the tray stocker 170 along the transfer rail 190. The disposal wafer may be conveyed from the pre-processing module 140 to the wafer stocker 130 along the transfer rail 190.

The FOUP transfer module 180 may be a module that conveys the first wafer, the second wafer, and the disposal wafer. The FOUP transfer module 180 may be a module that conveys a second FOUP. For example, the first wafer, the second wafer, and the disposal wafer may be placed in the second FOUP and conveyed.

The FOUP transfer module 180 may move along the transfer rail 190. The FOUP transfer module 180 may convey the second FOUP to the exchange module 120, the wafer stocker 130, and the pre-processing module 140.

The tray transfer module 185 may be a module that conveys the tray T including the test wafer pieces W and the test sample. The test wafer pieces W may be stored in the stub S and conveyed. The test sample may be stored in the grid holder GH and conveyed. The tray transfer module 185 may move along the transfer rail 190. The tray transfer module 185 may move along the transfer rail 190. The tray transfer module 185 may convey the tray T to the pre-processing module 140, the sample fabrication module 150, the analysis module 160, and the trace stocker 170.

The central module 195 may be installed inside the analysis chamber 2000. However, embodiments are not limited thereto, and for example, the central module 195 may be installed outside of the analysis chamber 2000. The central module 195 may store and track the history of the semiconductor fragments analyzed by the destructive analysis apparatus. For example, the central module 195 may track and control a wafer ID including information about the wafer, a tray ID including information about the tray T, a stub ID including information about the test wafer pieces W, and a grid ID including information about the test sample.

When using the destructive analysis automation apparatus according to embodiments, carrying out the wafer from the process chamber to the analysis chamber, and analyzing the wafer in the analysis chamber may be simplified and automated. Further, the history of wafer analysis work may be stored, tracked and controlled. Accordingly, the productivity and efficiency of the operation of the destructive analysis automation apparatus may be increased.

Figure 2:
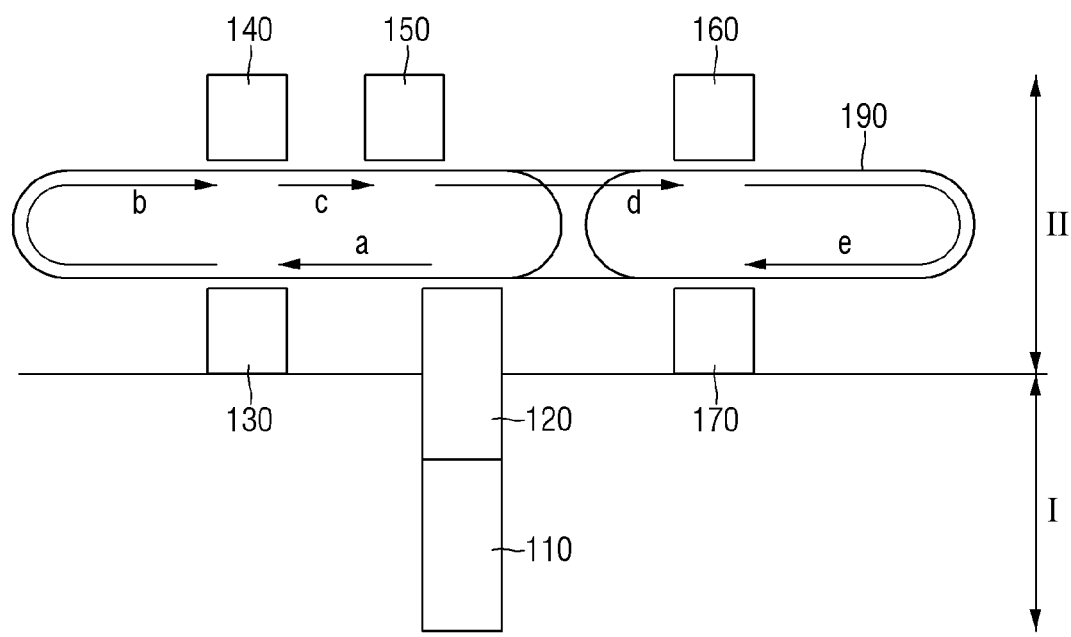
FIG. 2 is a layout diagram illustrating the operating method of the destructive analysis automation apparatus according to embodiments.

FIG. 2 is a layout diagram illustrating the operating method of the destructive analysis automation apparatus according to embodiments. Hereinafter, the operation of the destructive analysis automation apparatus according to embodiments will be described referring to FIGS. 1 and 2.

Referring to FIGS. 1 and 2, the first wafer may be loaded into the interlayer transport module 110 in the first region I. The first wafer may be loaded into the interlayer transport module 110 in the analysis chamber 2000.

The interlayer transport module 110 may store the first wafer in the first FOUP. The interlayer transport module 110 may convey the first FOUP in the vertical direction.

Subsequently, the interlayer transport module 110 may transfer the first FOUP to the exchange module 120. The exchange module 120 may convey the first wafer in the first FOUP to the second region II. The exchange module 120 may convey the first wafer in the first FOUP to the analysis chamber 2000. For example, the exchange module 120 may unload the first wafer in the first FOUP and store the first wafer in the second FOUP.

Next, the second FOUP that stores the first wafer may be moved from the exchange module 120 to the wafer stocker 130 (see reference numeral a). The second FOUP is placed in the FOUP transfer module 180 and may move along the transfer rail 190. The second FOUP may be loaded into the wafer stocker 130.

Next, the wafer stocker 130 may unload the first wafer from the second FOUP. The wafer stocker 130 may informationize the first wafer. The wafer stocker may form a second wafer. The second wafer may be obtained by informationizing the first wafer. The wafer stocker 130 may store the second wafer. The second wafer may be placed in the second FOUP again and unloaded from the wafer stocker 130.

The second FOUP may then be loaded into the pre-processing module 140 along the transfer rail 190 (see reference numeral b). The second FOUP may be placed in the FOUP transfer module 180 and conveyed along the transfer rail 190. The pre-processing module 140 may form the test wafer pieces and the disposal wafer. The test wafer pieces may be stored in the tray. The test wafer pieces may be stored in the stub. The disposal wafer may be stored in the second FOUP.

Subsequently, the tray T including the stub in which the test wafer pieces W are placed may be unloaded from the pre-processing module 140. The tray T may be moved to the sample fabrication module 150 along the transfer rail 190 (see reference numeral c). The tray T may be placed in the tray transfer module 185 and conveyed. The tray T may be loaded into the sample fabrication module 150. The sample fabrication module 150 may fabricate a sample for photographing/analyzing the test wafer pieces W. The sample fabrication module 150 may form the test sample. The test sample may be formed by cutting a part of the test wafer pieces W.

Next, the test sample may be unloaded from the sample fabrication module 150 and loaded into the analysis module 160 (see reference numeral d). The test sample may be fixed to the grid holder GH and stored in the tray T. The test sample may be placed in the tray T and be moved along the transfer rail 190. The tray T may be placed in the tray transfer module 185 and conveyed. The test sample may be photographed/analyzed inside the analysis module 160.

The test sample subjected to photographing/analysis may be unloaded from the analysis module 160. The test sample subjected to photographing/analysis may be conveyed to the tray stocker 170 along the transfer rail 190 (see reference numeral e). The test sample subjected to photographing/analysis may be placed in the tray T and conveyed. The tray stocker 170 may informationize and store the tray in which the test sample subjected to photographing/analysis is put.

If the analysis module 160 is in a full loading state, the test sample may not be immediately loaded from the sample fabrication module 150 to the analysis module 160. In this case, the test sample unloaded from the sample fabrication module 150 may be moved to the tray stocker 170. The tray in which the test sample is placed may be stored in the tray stocker 170 and wait.

When both the sample fabrication module 150 and the analysis module 160 are in the full loading state, the test wafer pieces W may not be loaded from the pre-processing module 140 to the sample fabrication module 150. In this case, the test wafer pieces W unloaded from the pre-processing module 140 may be moved to the tray stocker 170. The tray in which the test wafer pieces W are placed may be stored in the tray stocker 170 for a certain time.

The disposal wafer generated by the pre-processing module 140 may be moved to the wafer stocker 130 again. The disposal wafer is placed in the second FOUP and may be moved to the wafer stocker 130 along the transfer rail 190. The disposal wafer is unloaded to the wafer stocker 130, and the wafer stocker 130 may discard the disposal wafer.

Hereinafter, the EFEM according to embodiments will be described in FIGS. 3 to 8. As mentioned above, the EFEM may be installed on one side of the pre-processing module 140, the sample fabrication module 150, and the analysis module 160.

Figure 3:
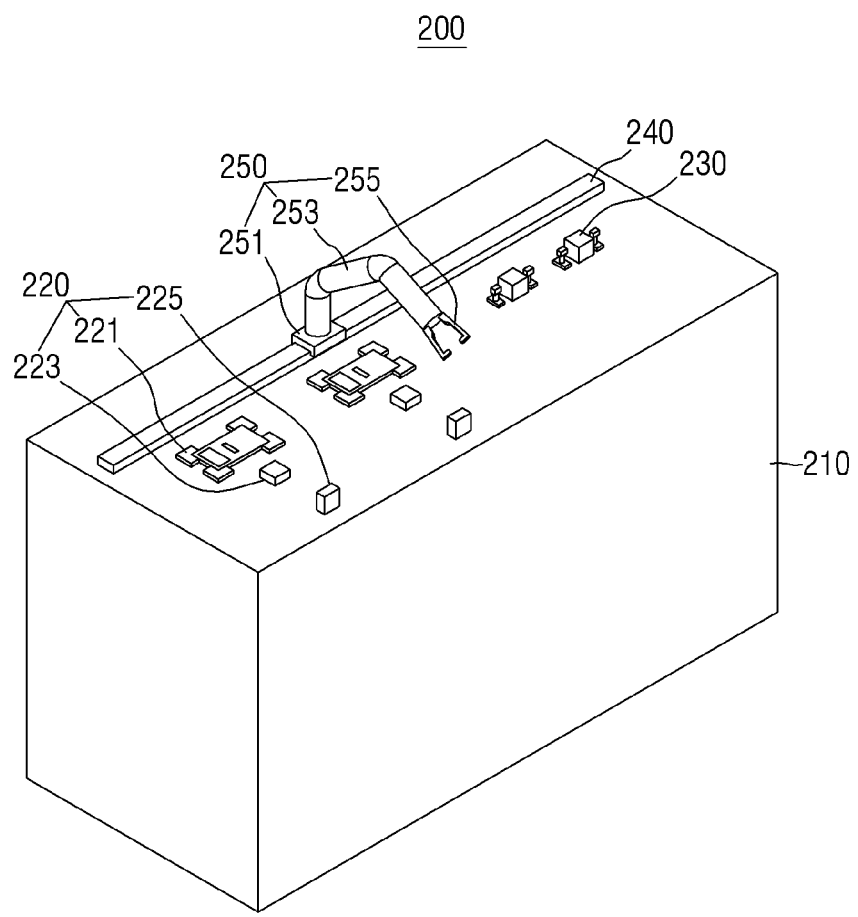
FIG. 3 is a schematic perspective view illustrating the EFEM according to embodiments.
Figure 4:
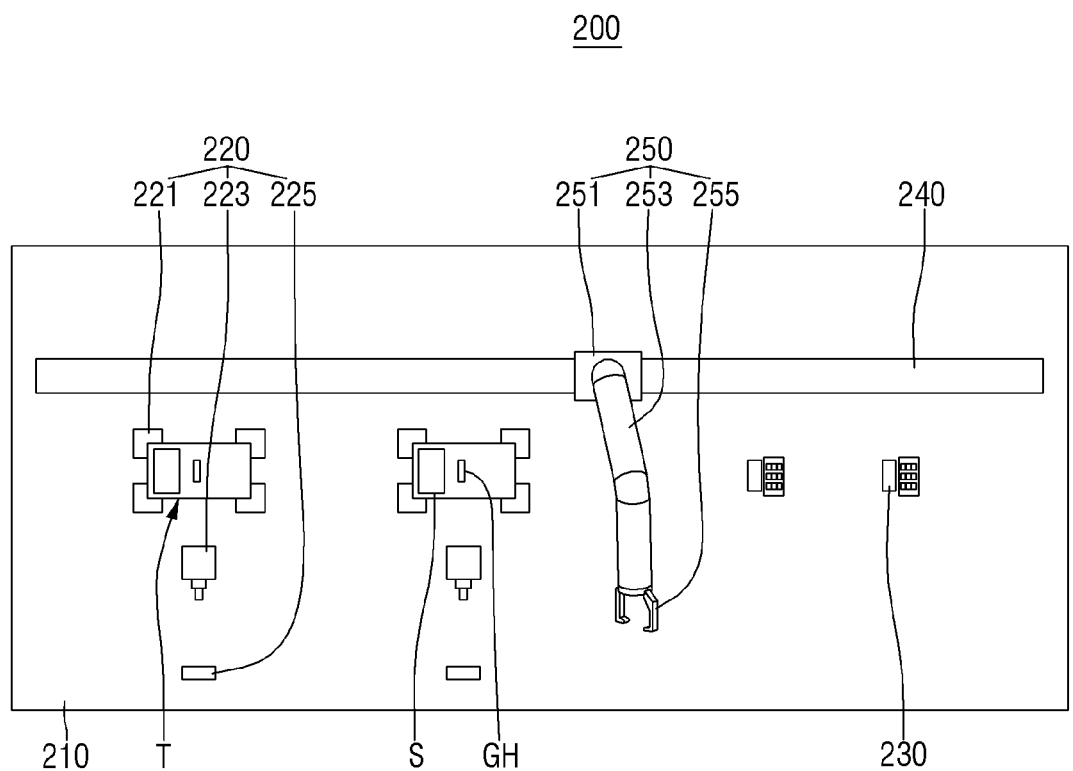
FIG. 4 is a schematic plan view illustrating the EFEM according to embodiments.
Figure 5:
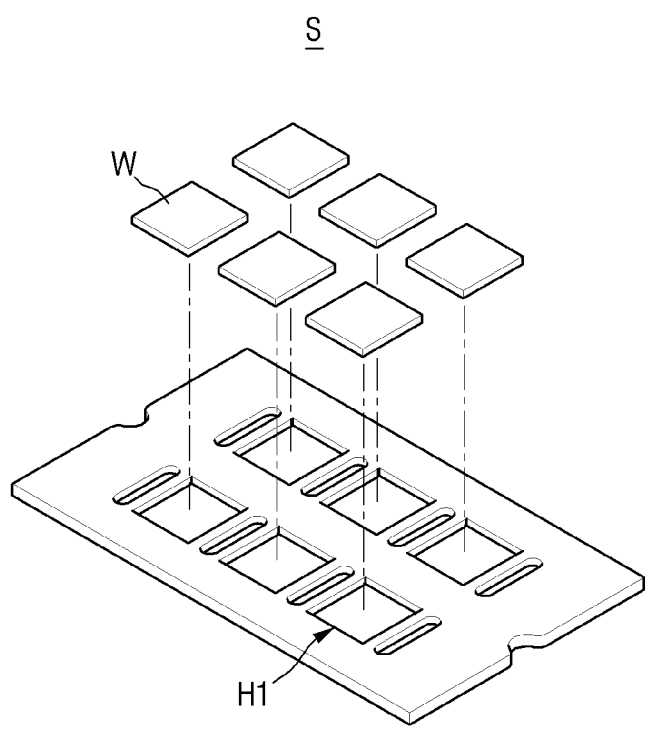
FIG. 5 is a combined perspective view illustrating the stub of FIG. 3.
Figure 6:
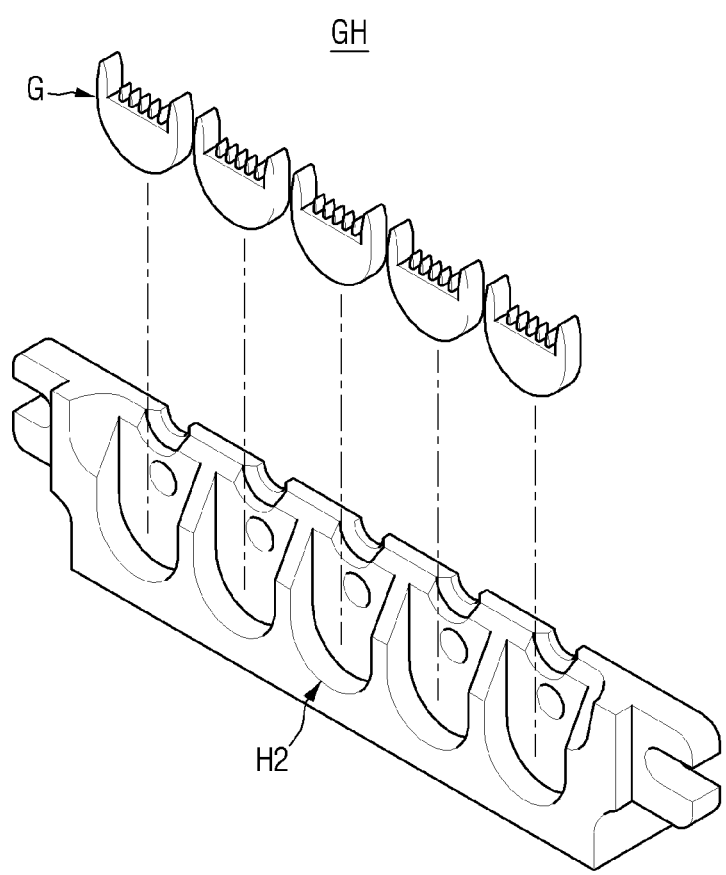
FIG. 6 is a combined perspective view illustrating the grid holder of FIG. 3.
Figure 7:
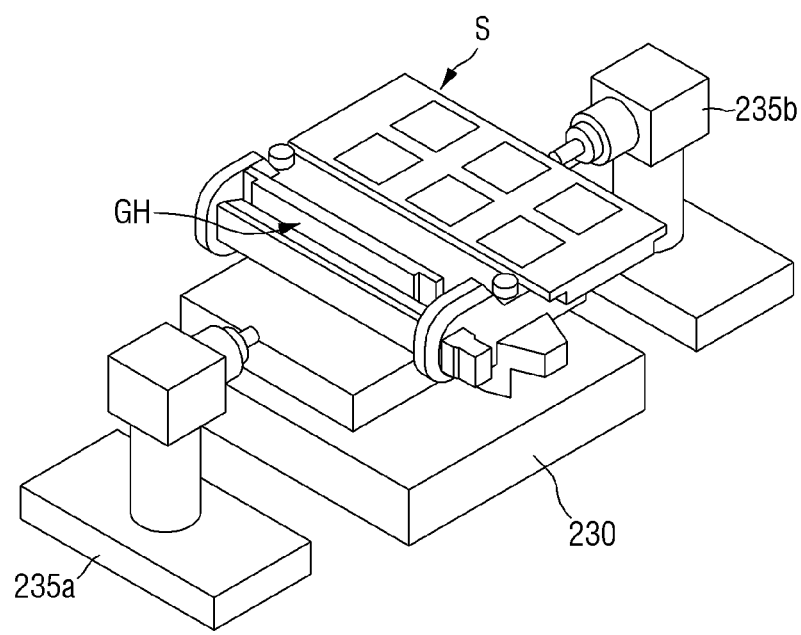
FIG. 7 is a perspective view illustrating a shuttle port of FIG. 3

FIG. 3 is a schematic perspective view illustrating the EFEM according to embodiments. FIG. 4 is a schematic plan view illustrating the EFEM according to embodiments. FIG. 5 is a combined perspective view illustrating the stub of FIG. 3. FIG. 6 is a combined perspective view illustrating the grid holder of FIG. 3. FIG. 7 is a perspective view illustrating a shuttle port of FIG. 3.

Referring to FIGS. 3 and 4, the EFEM according to embodiments may include a base module 210, a tray port 220, a shuttle port 230, a robot transfer rail 240, and a working robot 250.

The base module 210 may have a rectangular parallelepiped shape. The base module 210 may include a communication device that is able to communicate with the central module (195 of FIG. 1). The central module 195 may track and control the tray ID of the tray T and may communicate with the base module 210 to control the working robot 250. Further, the central module 195 may communicate with the base module 210 to control the tray transfer module 185. The tray port 220, the shuttle port 230, the working robot 250, and the like may be placed on one surface of the base module 210.

The tray port 220 may be placed on one surface of the base module 210. The tray port 220 includes a tray fixing unit 221, an ID reader unit 223, and a sensor unit 225. The tray fixing unit 221 is a portion in which the tray T is loaded into the tray port 220 and fixed. The tray T may be loaded into the tray port 220 by the tray transfer module 185. The tray T may be loaded into the tray fixing unit 221 and fixed thereto.

The ID reader unit 223 may be provided to be spaced apart from the tray fixing unit 221. Although the ID reader unit 223 is shown as being placed between the tray fixing unit 221 and the sensor unit 225, embodiments are not limited thereto. The ID reader unit 223 may read the tray ID. The ID reader unit 223 may transmit information of the tray ID to the central module 195.

The tray ID includes information about the tray T. For example, the tray ID includes information about the test wafer pieces W stored in the stub S and information about the test sample stored in the grid holder GH. One tray ID may be assigned to each of the plurality of trays T. The tray ID transmitted by the ID reader unit 223 may be managed, tracked and controlled by the central module 195.

The sensor unit 225 may be provided to be spaced apart from the ID reader unit 223. The sensor unit 225 may communicate with the tray transfer module 185 and the base module 210. For example, the sensor unit 225 may sense whether the tray T is loaded into the tray fixing unit 221. The sensor unit 225 may transmit the sensed information to the tray transfer module 185 or the base module 210.

As an example, when the tray T is loaded into the tray fixing unit 221, the sensor unit 225 may communicate with the tray transfer module 185 to prevent the other tray T from being loaded from the tray transfer module 185 to the tray port 220 in advance. When there is no state in which the tray T is loaded into the tray fixing unit 221, the sensor unit 225 may communicate with the tray transfer module 185 to load the tray T from the tray transfer module 185 to the tray port 220.

As another example, when the tray T is loaded into the tray fixing unit 221, the sensor unit 225 may communicate with the base module 210 to control the working robot 250 to be able to convey the stub S of the tray T placed in the tray fixing unit 221 and the grid holder GH to the shuttle port 230. The base module 210 may control the working robot 250 to convey the stub S and the grid holder GH. When there is no state in which the tray T is loaded into the tray fixing unit 221, the sensor unit 225 may communicate with the base module 210 to stop the operation of the working robot 250.

The shuttle port 230 may be placed on the base module 210. The shuttle port 230 may be spaced apart from the tray port 220. The shuttle port 230 may fix one stub S and one grid holder GH. The shuttle port 230 may be loaded into the main module or main device (MM of FIG. 10). For example, the stub S and the grid holder GH inside the shuttle port 230 may be loaded into the main module MM.

Referring to FIG. 5, the stub S may include six stub grooves H1. Each of the stub grooves H1 may be grooves in which the test wafer pieces W are stored. Each test wafer piece W fixed to the stub groove H1 may be stored in different IDs, for example, the stub IDs. Each stub ID may be stored in the tray ID and reported to the central module 195 by a computer.

Referring to FIG. 6, the grid holder GH includes grid grooves H2 and grids G. The grid grooves H2 may be grooves to which the grids G are fixed. The grids G are portions to which the test sample is fixed. Information about the test sample may be stored in different IDs, for example, the grid IDs. The grid IDs may be reported to the central module 195 by a computer. Although it is shown that five grids G are stored in one grid holder GH, the number of grids G stored in one grid holder GH is not limited thereto.

Referring to FIG. 7, the shuttle port 230 includes a body portion, a first groove, and a second groove. The body portion may fix and support the first groove and the second groove. The body portion may fix the stub S and the grid holder GH. The first groove may be a groove that fixes the stub S. The stub S may be seated in the first groove and coupled with the shuttle port 230. The second groove may be a groove that fixes the grid holder GH. The grid holder GH may be seated in the second groove and coupled with the shuttle port 230.

The EFEM 200 according to embodiments may further include a first fixing unit 235a and a second fixing unit 235b.

The first fixing unit 235a may be provided on one side of the shuttle port 230. The first fixing unit 235a may perform a function of completely fixing the grid holder GH to the shuttle port 230. Further, the first fixing unit 235a may also perform a function of disassembling the grid holder GH and the shuttle port 230. The second fixing unit 235b may be provided on the other side of the shuttle port 230. The second fixing unit 235b may perform a function of completely fixing the stub S to the shuttle port 230. Further, the second fixing unit 235b may perform a function of disassembling the stub S and the shuttle port 230. Each of the first and second fixing units 235a and 235b may completely fix the shuttle port 230 so that the stub S and the grid holder GH are not shaken or become detached when the shuttle port 230 is conveyed and transported inside the apparatus. Each of the first and second fixing units 235a and 235b may be fixed onto the base module 210 or may be moved.

Referring to FIGS. 3 and 4 again, the robot transfer rail 240 may extend in one direction on one surface of the base module 210. The robot transfer rail 240 may extend in the direction in which the working robot 250 moves. The working robot 250 may move on the robot transfer rail 240 along the robot transfer rail 240.

The working robot 250 may be installed on the base module 210. The working robot 250 may be installed on the robot transfer rail 240. The working robot 250 may be movable in one direction along the robot transfer rail 240. The working robot 250 may convey the stub S and the grid holder GH inside the tray T. The working robot 250 may convey the shuttle port 230.

For example, the working robot 250 may grasp the stub S inside the tray T and convey it to the shuttle port 230. The working robot 250 may grasp the stub S inside the tray T and convey it to the first groove of the shuttle port 230. The working robot 250 may grasp the grid holder GH inside the tray T and convey it to the shuttle port 230. The working robot 250 may grasp the grid holder GH inside the tray T and convey it to the second groove of the shuttle port 230. The working robot 250 may grasp the shuttle port 230 and load it into the main module.

The working robot 250 includes a support unit 251, a robot arm 253, and a robot hand 255. The support unit 251 may be a portion fixed to the robot transfer rail 240. The support unit 251 may be a portion for fixing the robot arm 253 and the robot hand 255. The robot arm 253 is a robot arm that connects the support unit 251 and the robot hand 255. The robot hand 255 may be a portion that grasps the stub S, the grid holder GH, and the shuttle port 230. The operating method of the working robot 250 will be described in detail later referring to FIGS. 11 to 24.

In embodiments, the two or more tray ports 220 may be included. One tray port 220 may be a main tray port and the other tray port 220 may be a sub tray port. The sub tray port may be used temporarily when the main tray port does not operate normally.

In embodiments, the two or more shuttle ports 230 may be included. One shuttle port 230 may be a main shuttle port and the other shuttle port 230 may be a sub shuttle port. The sub shuttle port may be used temporarily when the main shuttle port does not operate normally.

Figure 8:
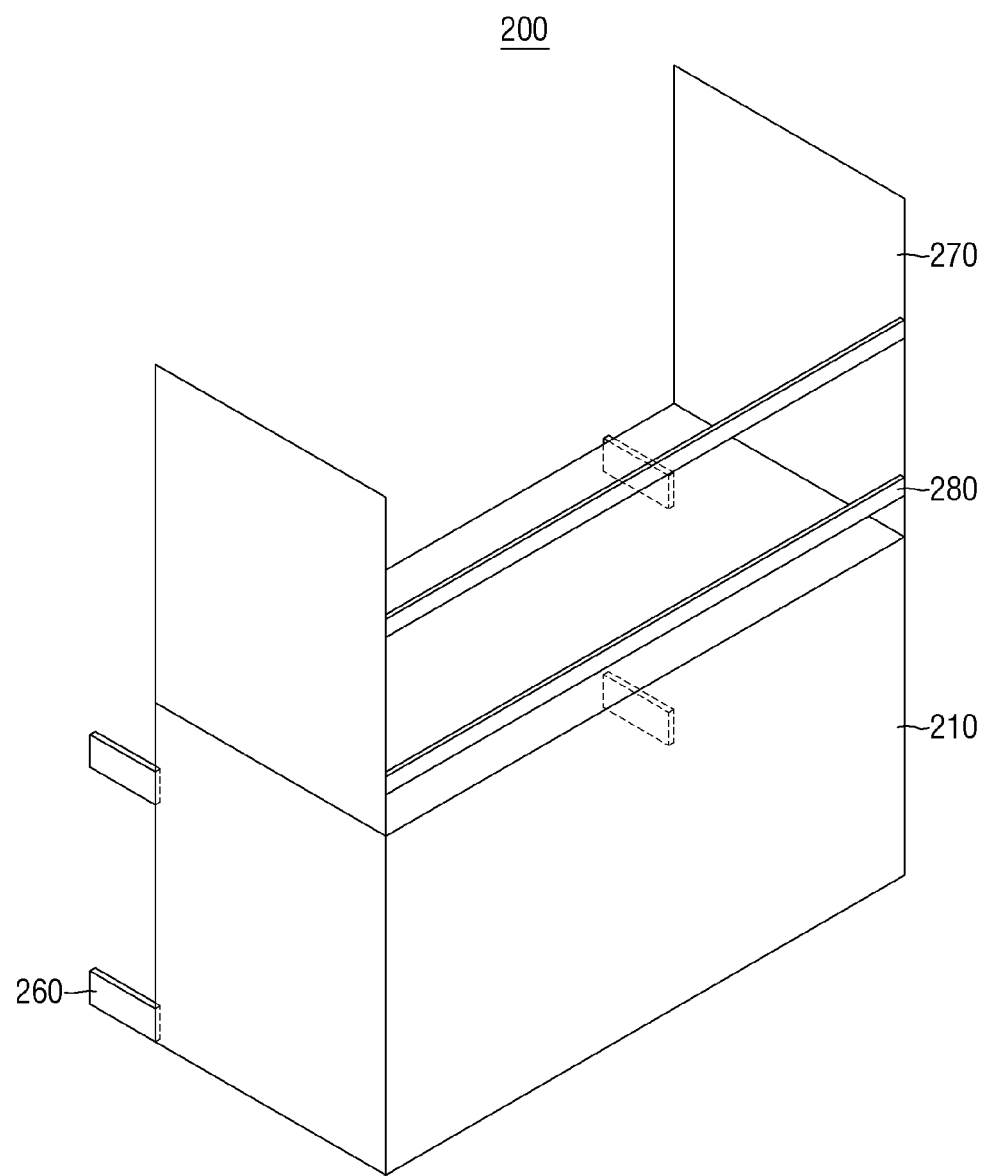
FIGS. 8 and 9 are perspective views illustrating the EFEM according to embodiments.
Figure 9:
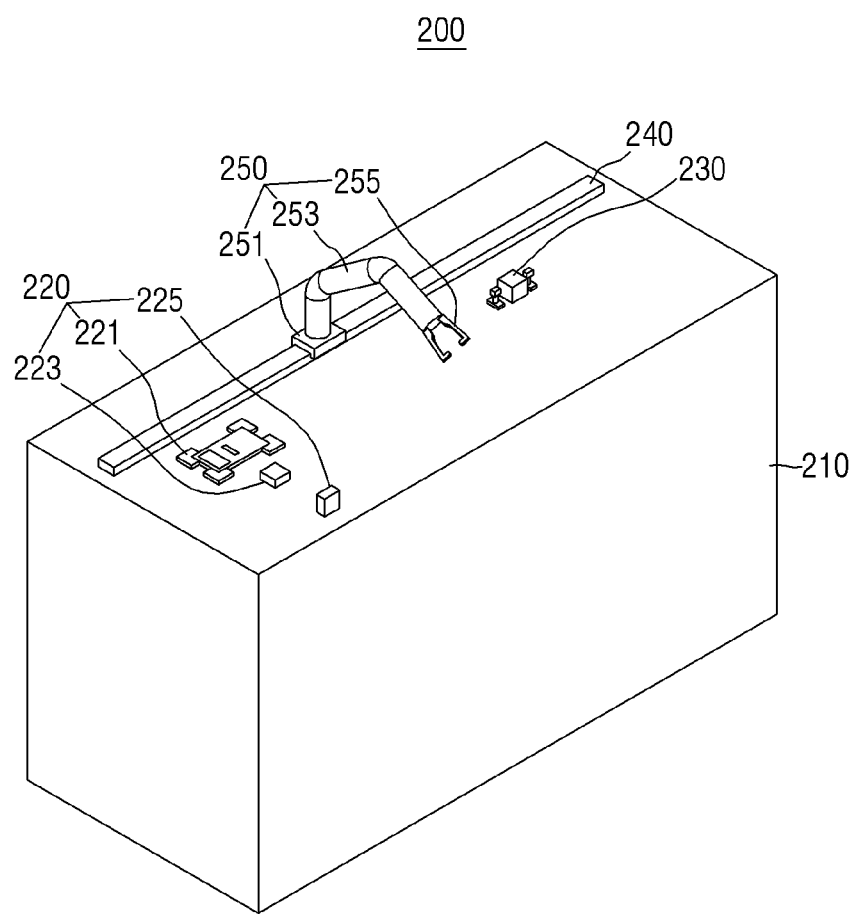

FIGS. 8 and 9 are perspective views illustrating the EFEM according to embodiments.

Referring to FIG. 8, the EFEM according to embodiments may further include a fastening unit 260, a screen fence 270, and a protection bar 280.

The fastening unit 260 may be provided on the side surface of the base module 210. The fastening unit 260 may fix the main module (MM of FIG. 10) and the EFEM 200. Although four fastening units 260 are shown, the number of fastening units 260 is not limited thereto.

The screen fence 270 may extend in the vertical direction along the side surfaces of the base module 210. One of the screen fences 270 may extend in the vertical direction along one side surface of the base module 210. The other of the screen fence 270 may extend in the vertical direction along the other side surface of the base module 210. The two screen fences 270 may be opposite to each other. The screen fence 270 may physically limit a drive region of the working robot on the base module 210. In addition, the screen fence 270 may block the approach of workers to prevent an occurrence of environmental safety accidents.

The protection bar 280 may connect the two screen fences 270 to each other. The protection bar 280 may extend horizontally. The protection bar 280 may physically limit the drive region of the working robot on the base module 210, similar to the screen fence 270. Further, the protection bar 280 may block the approach of the worker to prevent an occurrence of environmental safety accidents.

Referring to FIG. 9, an EFEM 200 according to embodiments may include only one tray port 220 and only one shuttle port 230. The sub tray port and sub shuttle port may not be needed depending on situations. In this case, the EFEM 200 may include only one tray port 220 and only one shuttle port 230. As the number of tray ports 220 and shuttle ports 230 decreases, an area of the base module 210 may decrease.

Figure 10:
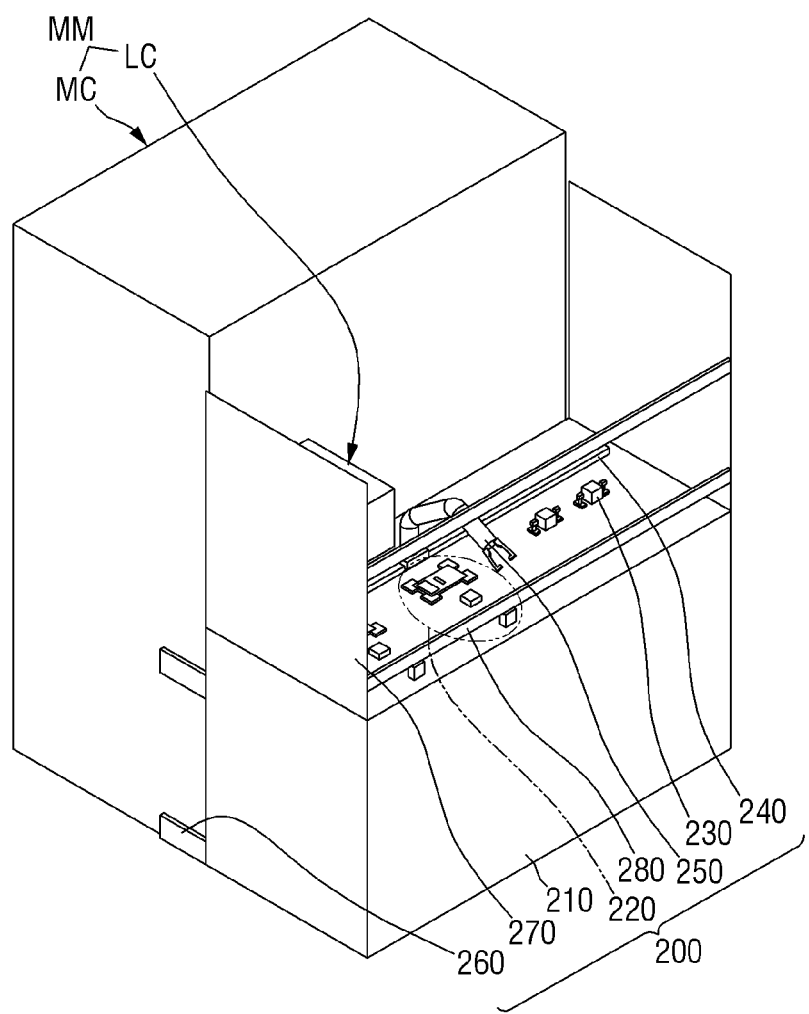
FIG. 10 is a perspective view illustrating a destructive analysis automation apparatus including the EFEM of FIG. 3.

FIG. 10 is a perspective view illustrating a destructive analysis automation apparatus including the EFEM of FIG. 3.

Referring to FIG. 10, the destructive analysis automation apparatus according to embodiments may include the EFEM 200 and the main module MM. The EFEM 200 may be the EFEM 200 described in FIGS. 3 to 9. The main module MM may be at least one of the pre-processing module 140, the sample fabrication module 150, and the analysis module 160 described in FIGS. 1 and 2.

The EFEM 200 may be coupled with the main module MM. The EFEM 200 may be installed on one side of the main module MM. The fastening unit 260 of the EFEM 200 may be coupled to the main module MM. The fastening unit 260 may couple and fix the EFEM 200 and the main module MM.

The main module MM includes a main chamber MC and a load lock chamber LC. The load lock chamber LC may be a space into which the shuttle port 230 is loaded. The shuttle port 230 loaded into the load lock chamber LC may be loaded into the main chamber MC again. Various semiconductor destructive analysis works may be performed inside the main chamber MC.

As an example, when the main module MM is the pre-processing module 140, the pre-processing work is performed inside the main chamber MC of the main module MM. The pre-processing work is performed to form the test wafer piece W. As another example, when the main module MM is the sample fabrication module 150, the sample fabrication work is performed inside the main chamber MC of the main module MM. The sample fabrication work is performed to form a test sample. As still another example, when the main module MM is the analysis module 160, the photographing/analysis works are performed inside the main chamber MC of the main module MM.

When using the destructive analysis automation apparatus according to embodiments, the semiconductor destructive analysis work may be performed by an automation process. First, the sample aid necessary for the semiconductor destructive analysis work, for example, the test wafer piece W or the test sample is loaded into the EFEM 200. The sample aid is loaded into the load lock chamber LC and the main chamber MC by the automation process. The sample aid may be automatically unloaded from the main module MM after the semiconductor destructive analysis work has been performed in the main chamber MC. The sample aid includes IDs each including information about the sample aid. The IDs are reported to the central module 195 by a computer. Therefore, the history of the semiconductor destructive analysis work may be tracked and controlled.

Figure 11:
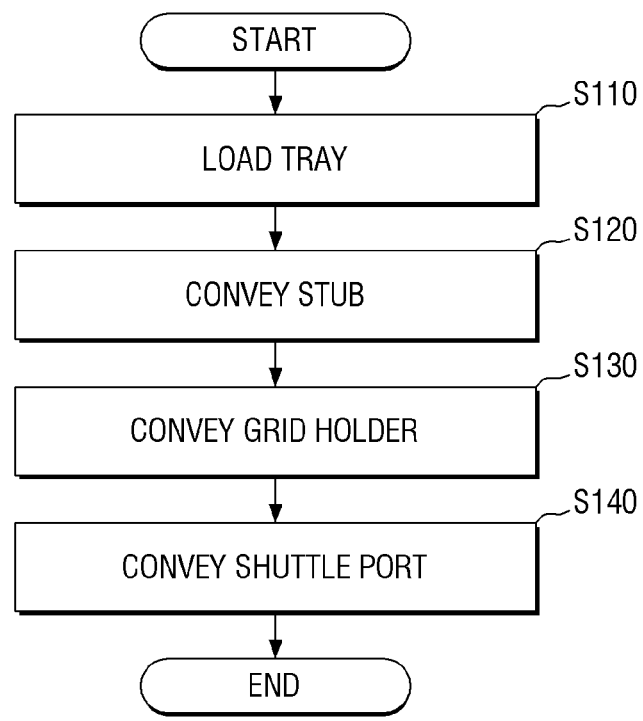
FIG. 11 is a flowchart illustrating the operating method of the destructive analysis automation apparatus according to embodiments.

Hereinafter, the operating method of the destructive analysis automation apparatus according to embodiments will be described in detail referring to FIGS. 11 to 24. FIG. 11 is a flowchart illustrating the operating method of the destructive analysis automation apparatus according to embodiments. For reference, FIG. 11 may be a diagram showing the operating method of the destructive analysis automation apparatus before the sample aid is loaded into the main module.

Referring to FIGS. 3, 4, and 11, the operating method of the destructive analysis automation apparatus according to embodiments may include a step of loading the tray T (S110), a step of conveying the stub S (S120), a step of conveying the grid holder GH (S130), and a step of conveying the shuttle port 230 (S140).

For example, the tray T may be loaded into the tray port 220. The tray T may be loaded into the tray fixing unit 221 of the tray port 220. The working robot 250 then conveys the stub S to the shuttle port 230. The working robot 250 conveys the grid holder GH to the shuttle port 230. The shuttle port 230 is loaded into the main module MM by the working robot 250. Although the working robot 250 is shown to convey the grid holder GH after conveying the stub S, embodiments are not limited thereto. The working robot 250 may convey the stub S after conveying the grid holder GH.

Figure 12:
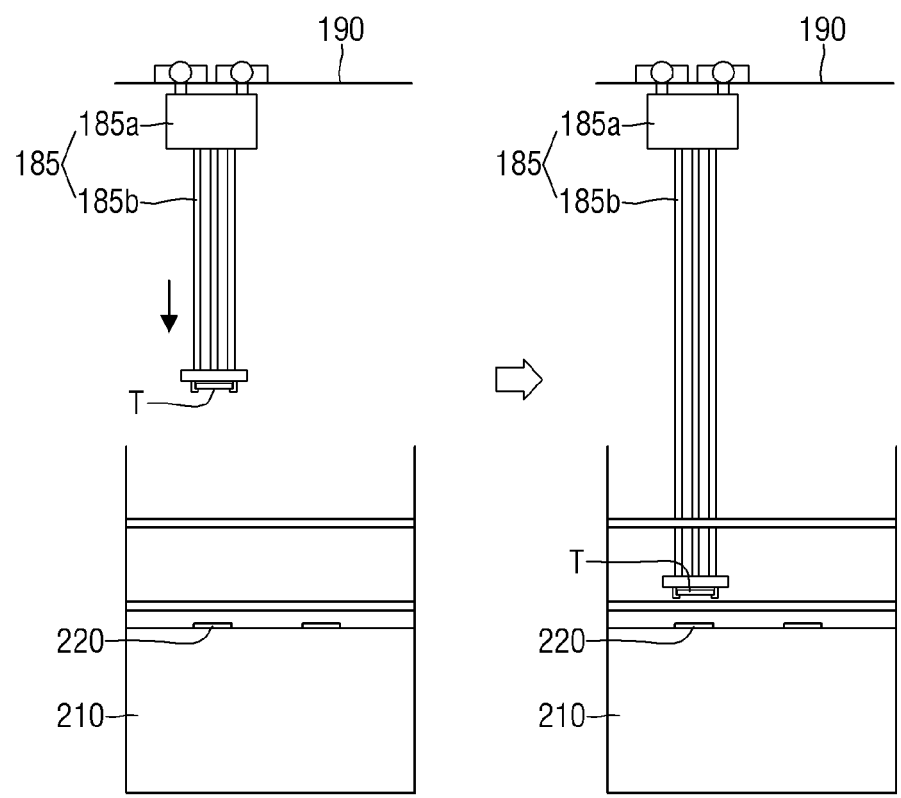
FIG. 12 is a diagram illustrating the step S110 of FIG. 11.

FIG. 12 is a diagram illustrating the step S110 of FIG. 11.

Referring to FIG. 12, the tray T may be loaded into the tray port 220 (S110). The tray T may be loaded into the tray fixing unit 221. The tray T may be fixed to the tray fixing unit 221.

The tray transfer module 185 may be moved along the transfer rail 190 and located on the EFEM 200. The tray transfer module 185 may include an OHT 185a and an OHT hand 185b. The OHT 185a may be a space in which a plurality of trays T are stored. The OHT 185a may be connected to the transfer rail 190. The OHT 185a may move along the transfer rail 190. The OHT hand 185b may be placed inside the OHT 185a. The OHT hand 185b may extend in the vertical direction.

For example, the OHT 185a may be installed on the ceiling of the analysis chamber 2000, and the EFEM 200 may be installed on the bottom surface of the analysis chamber 2000. In order to load the tray T stored in the OHT 185a into the EFEM 200, it is necessary to lower the tray T in the vertical direction. At this time, the OHT hand 185b grasps the tray T and may be lowered in the vertical direction. The OHT hand 185*b* may load the tray T into the tray port 220 of the EFEM 200.

When the tray T is already loaded into the tray port 220 of the EFEM 200, the sensor unit 225 of the tray port 220 may communicate with the tray transfer module 185 to control the tray transfer module 185 so that the tray T is not loaded into the tray port 220.

Figure 13:
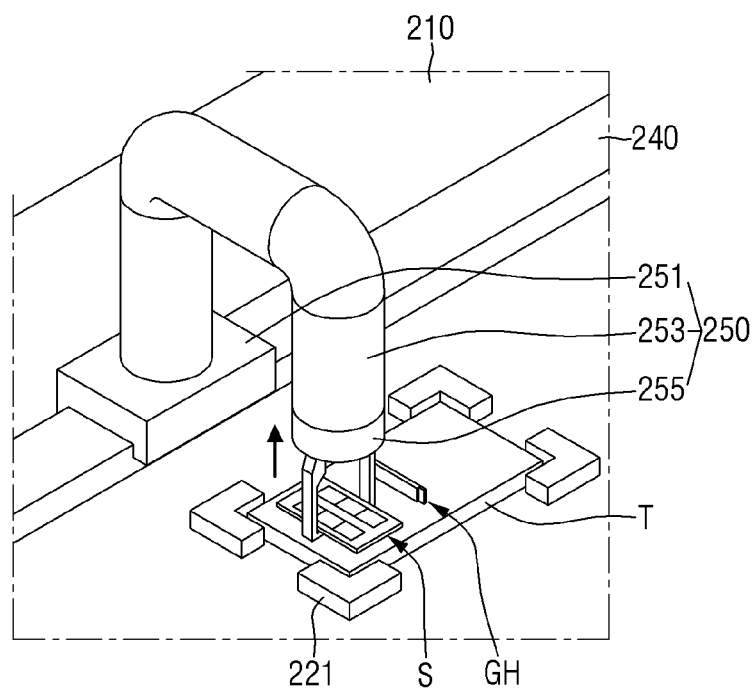
FIGS. 13 and 14 are diagrams illustrating the step S120 of FIG. 11.
Figure 14:
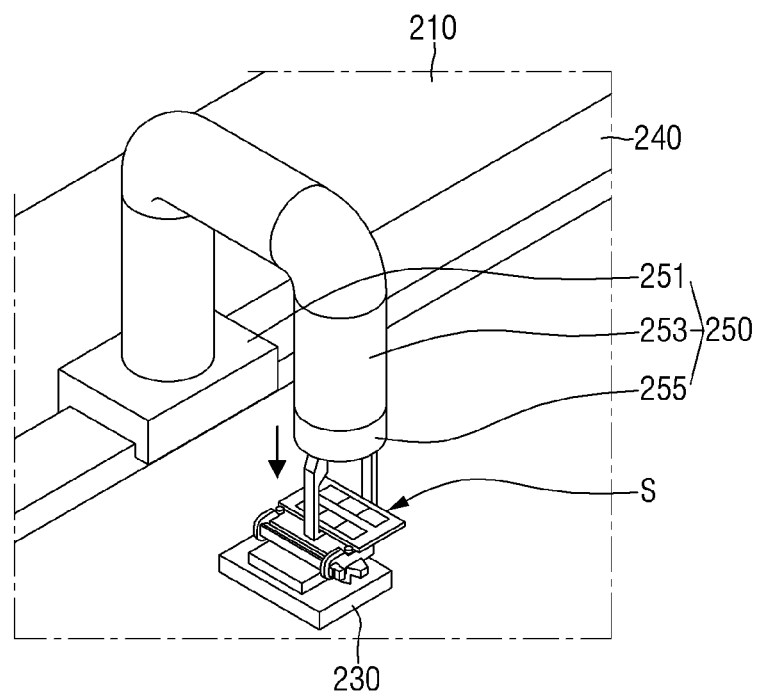

FIGS. 13 and 14 are diagrams illustrating the step S120 of FIG. 11.

Referring to FIGS. 13 and 14, the stub S in the tray T may be conveyed to the shuttle port 230 (S120).

In FIG. 13, the working robot 250 may move to a position adjacent to the tray port 220. The robot hand 255 of the working robot 250 may grasp the stub S in the tray T. Next, the working robot 250 may be moved in one direction, while grasping the stub S. The working robot 250 may move to a position adjacent to the shuttle port 230. The working robot 250 moves along the robot transfer rail 240.

In FIG. 14, the robot hand 255 may place the stub S on the shuttle port 230. For example, the stub S may be placed in the first groove of the shuttle port 230. The stub S may be fixed to the first groove of the shuttle port 230. When the stub S is already loaded into the shuttle port 230, the sensor unit 225 of the tray port 220 may communicate with the base module 210. The base module 210 may control the working robot 250 so that the stub S is not conveyed to the shuttle port 230.

Figure 15:
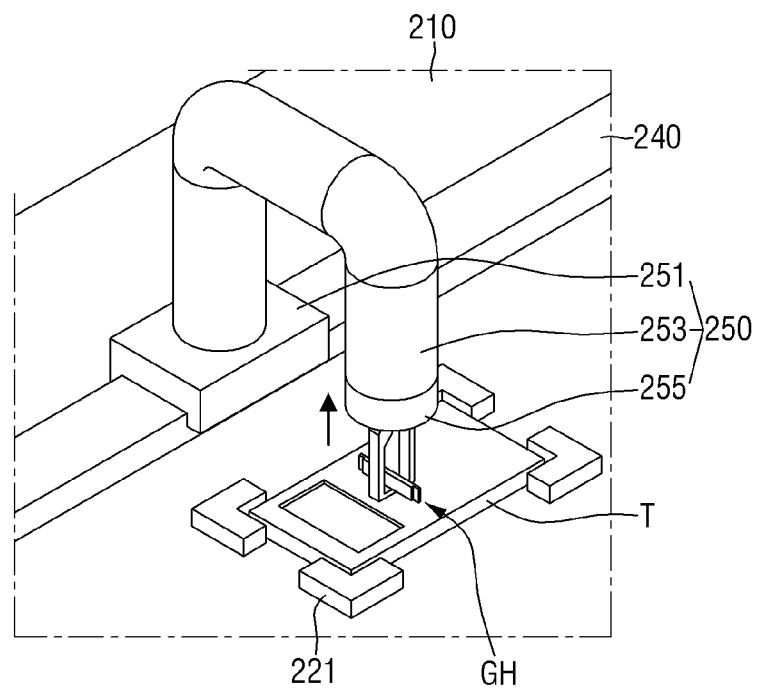
FIGS. 15, 16, and 17 are diagrams illustrating the step S130 of FIG. 11.
Figure 16:
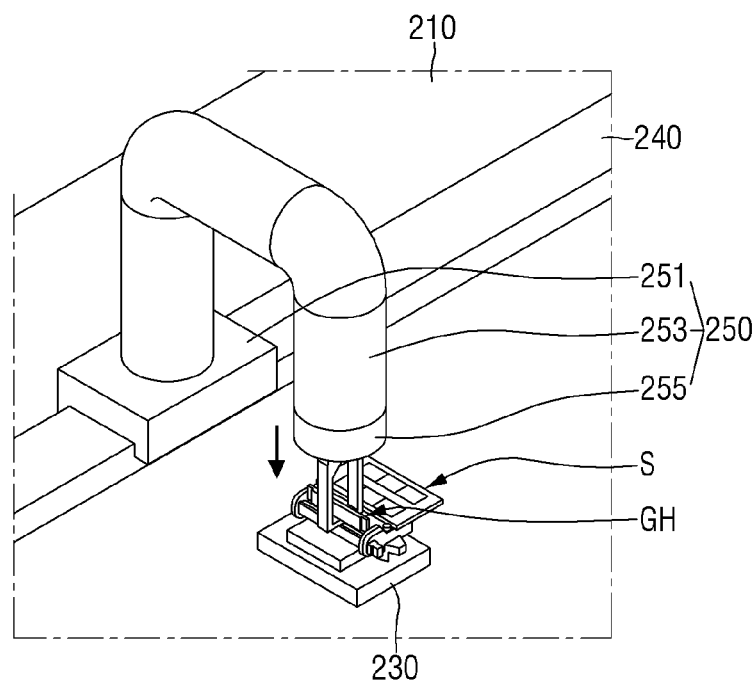
Figure 17:
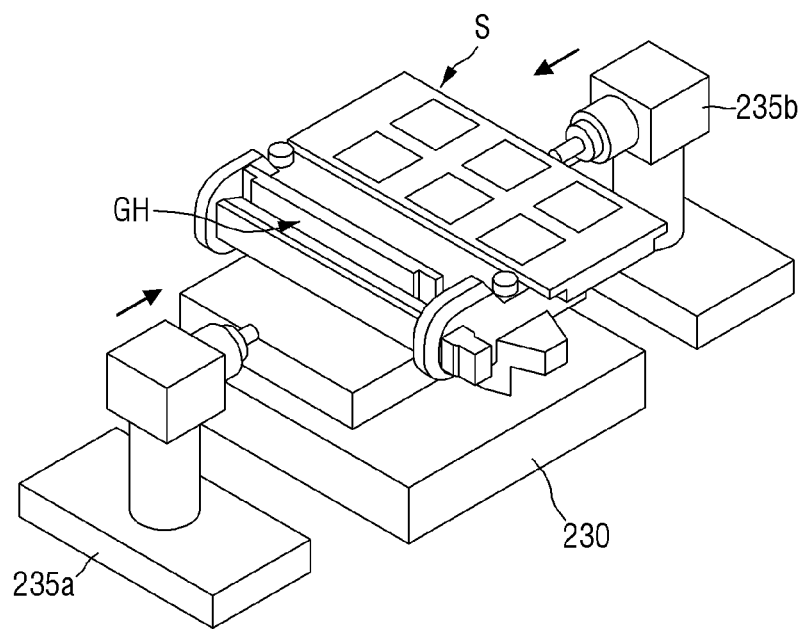

FIGS. 15 to 17 are diagrams illustrating the step S130 of FIG. 11.

Referring to FIGS. 15 to 17, the grid holder GH in the tray T may be conveyed to the shuttle port 230 (S130).

In FIG. 15, the working robot 250 may move to a position adjacent to the tray port 220 again. The working robot 250 moves from the shuttle port 230 toward the tray port 220 in one direction. The robot hand 255 of the working robot 250 may grasp the grid holder GH in the tray T. The working robot 250 may then be moved in one direction again, while grasping the grid holder GH. The working robot 250 may move to a position adjacent to the shuttle port 230. The working robot 250 moves along the robot transfer rail 240.

In FIG. 16, the robot hand 255 may place the grid holder GH on the shuttle port 230. Specifically, the grid holder GH may be placed in the second groove of the shuttle port 230. The grid holder GH may be fixed to the second groove of the shuttle port 230. When the grid holder GH is already loaded into the shuttle port 230, the sensor unit 225 of the tray port 220 may communicate with the base module 210. The base module 210 may control the working robot 250 so that the grid holder GH is not conveyed to the shuttle port 230.

In FIG. 17, the first fixing unit 235*a* and the second fixing unit 235*b* may fix the grid holder GH and the stub S, respectively.

The first fixing unit 235*a* is placed on one side of the shuttle port 230 and may fix the grid holder GH. The second fixing unit 235*b* is placed on the other side of the shuttle port 230 and may fix the stub S. The first fixing unit and the second fixing unit 235*a* and 235*b* may completely fix the grid holder GH, the stub S and the shuttle port 230 so that the grid holder GH and the stub S are not shaken, while the shuttle port 230 is being conveyed.

Figure 18:
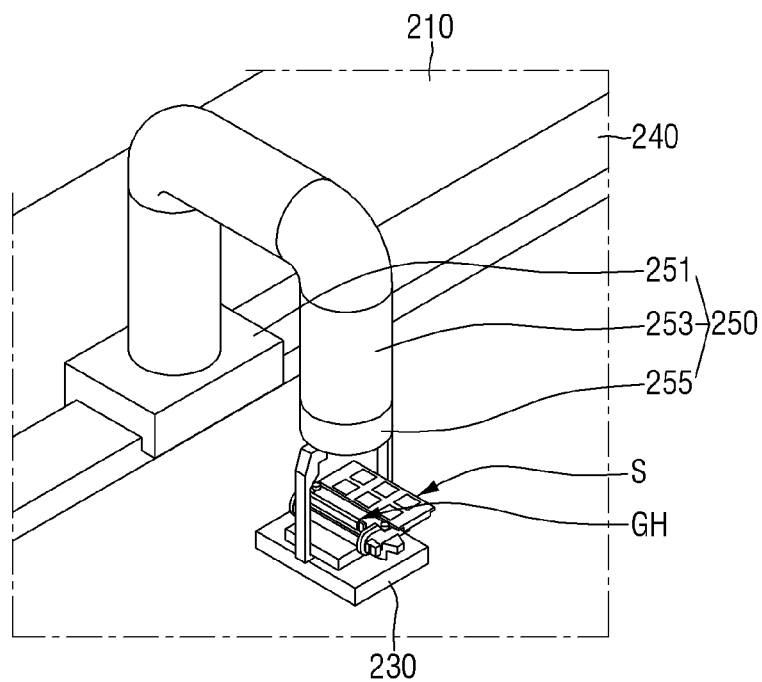
FIGS. 18 and 19 are diagrams illustrating the step S140 of FIG. 11.
Figure 19:
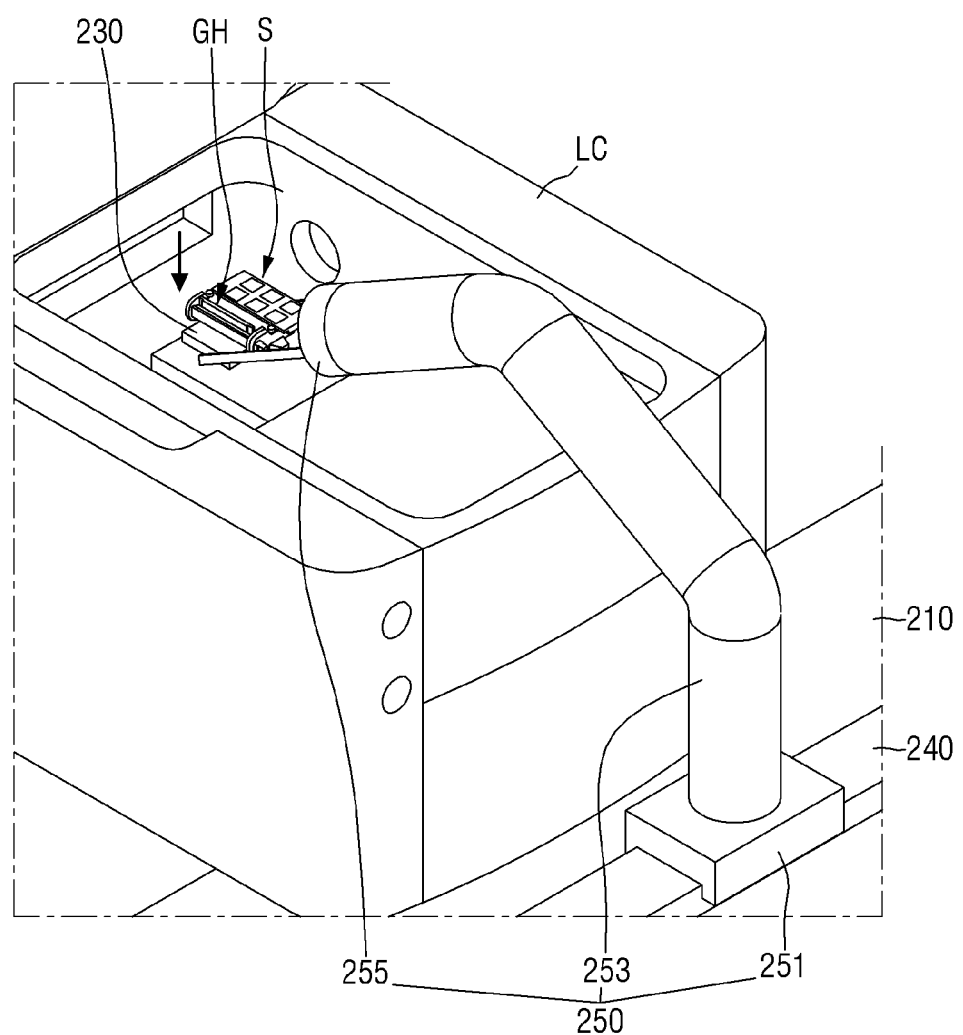

FIGS. 18 and 19 are diagrams illustrating the step S140 of FIG. 11.

Referring to FIGS. 18 and 19, the shuttle port 230 may be conveyed to the main module MM (S140).

In FIG. 18, the robot hand 255 of the working robot 250 may grasp the shuttle port 230. The working robot 250 may grasp the shuttle port 230 and convey it to the main module MM.

In FIG. 19, the working robot 250 may load the shuttle port 230 into the load lock chamber LC of the main module MM. The shuttle port 230 is loaded into the main chamber MC via the load lock chamber LC. The stub S and the grid holder GH of the shuttle port 230 are separated inside the main chamber MC. The semiconductor destructive analysis work may be performed inside the main chamber MC.

As an example, when the main module MM is the pre-processing module 140, the pre-processing work is performed to form the test wafer pieces, and the test wafer pieces are stored in the stub S. The stub S may be fixed to the shuttle port 230 again.

As another example, when the main module MM is the sample fabrication module 150, the sample fabrication work is performed to fabricate a test sample, and the test sample is stored in the grid holder GH. The grid holder GH may be fixed to the shuttle port 230 again.

Figure 20:
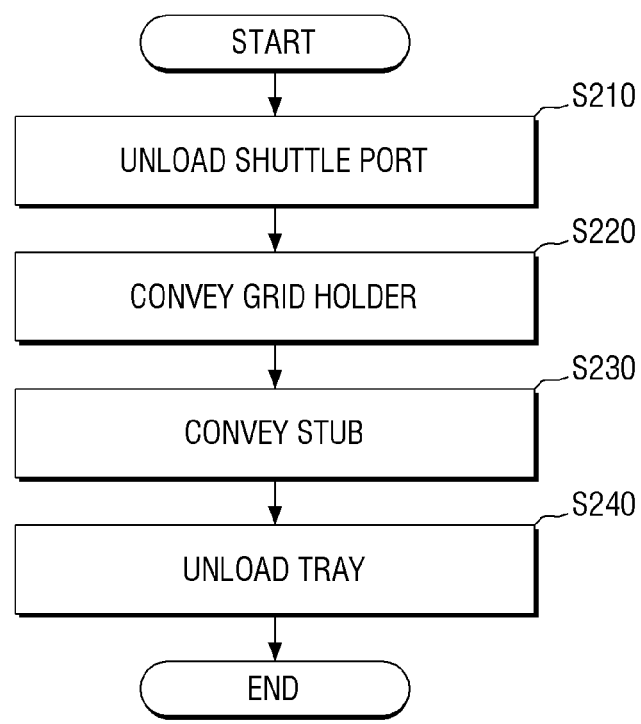
FIG. 20 is a flowchart illustrating the operating method of the destructive analysis automation apparatus according to embodiments.

FIG. 20 is a flowchart illustrating the operating method of the destructive analysis automation apparatus according to embodiments. For reference, FIG. 20 may be a diagram showing the operating method of the destructive analysis automation apparatus after the sample aid is unloaded from the main module. The operation in which the sample aid is unloaded from the main module may be a reverse order of the operation in which the sample aid is loaded into the main module.

Referring to FIGS. 3, 4, and 20, the operating method of the destructive analysis automation apparatus according to embodiments may include a step of unloading the shuttle port (S210), a step of conveying the grid holder (S220), a step of conveying the stub (S230), and a step of unloading the tray (S240). Detailed contents of each step will be described using FIGS. 21 to 24.

Figure 21:
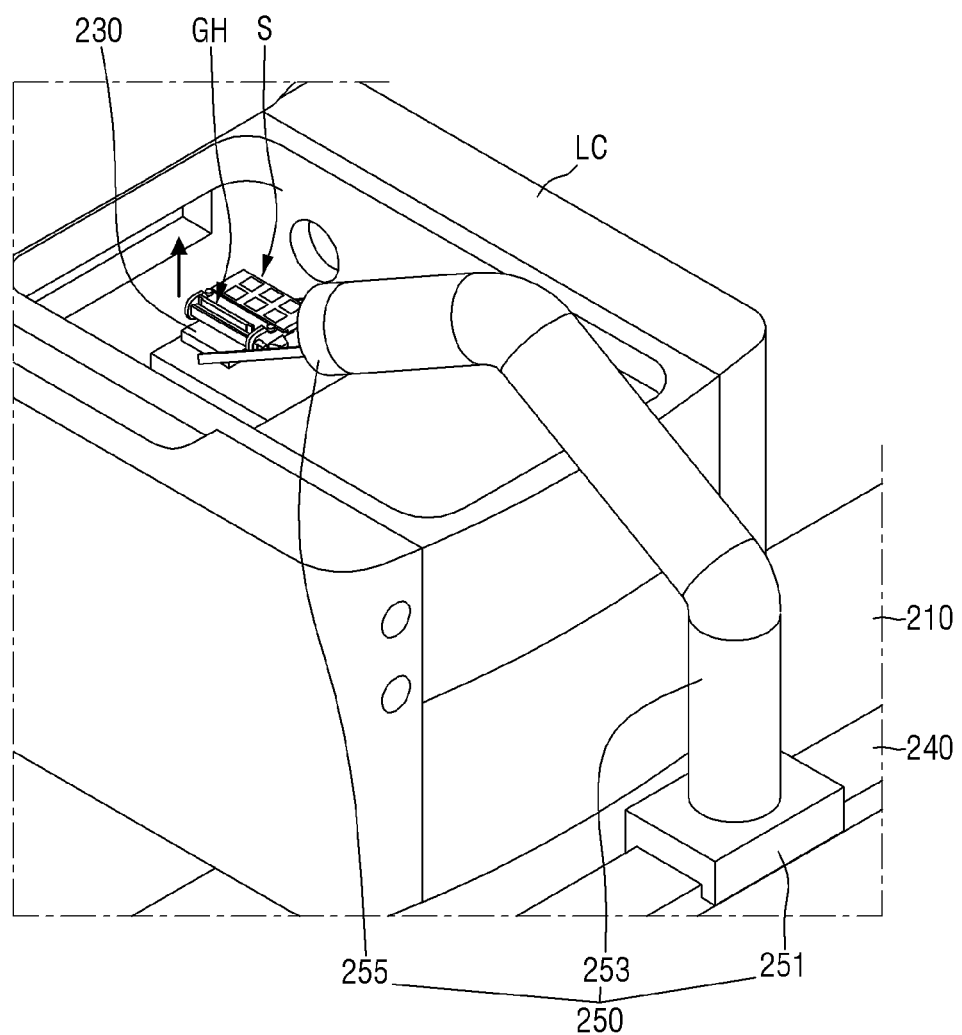
FIG. 21 is a diagram illustrating the step S210 of FIG. 20.

FIG. 21 is a diagram illustrating the step S210 of FIG. 20.

Referring to FIG. 21, the shuttle port 230 may be unloaded from the main module MM. The shuttle port 230 may be unloaded from the load lock chamber LC (S210).

The shuttle port 230 may be unloaded, while fixing the stub S and the grid holder GH. For example, the sample aid formed by performing the semiconductor destructive analysis work in the main module MM, for example, the test wafer pieces and the test sample may be fixed to the stub S and the grid holder GH, respectively. The stub S and the grid holder GH may be unloaded from the load lock chamber LC, while being fixed to the shuttle port 230. The shuttle port 230 may then be conveyed to the base module 210. The working robot 250 may grasp the shuttle port 230 and convey it to the base module 210.

Figure 22:
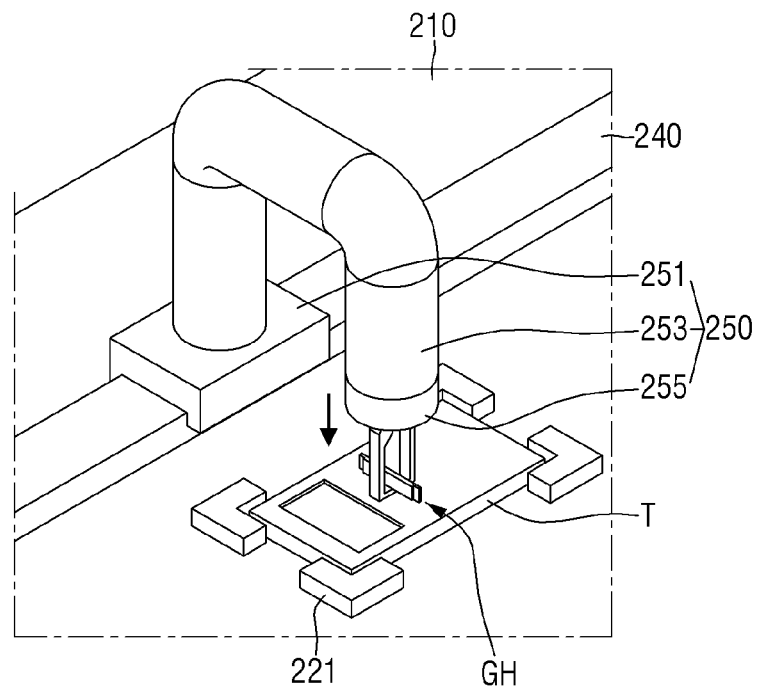
FIG. 22 is a diagram illustrating the step S220 of FIG. 20.

FIG. 22 is a diagram illustrating the step S220 of FIG. 20.

Referring to FIG. 22, the grid holder GH may be conveyed to the tray T (S220). The working robot 250 grasps the grid holder GH fixed to the shuttle port 230. After that, the working robot 250 may move to a position adjacent to the tray port 220, while grasping the grid holder GH. The working robot 250 may place the grasped grid holder GH on the tray T fixed to the tray port 220.

Figure 23:
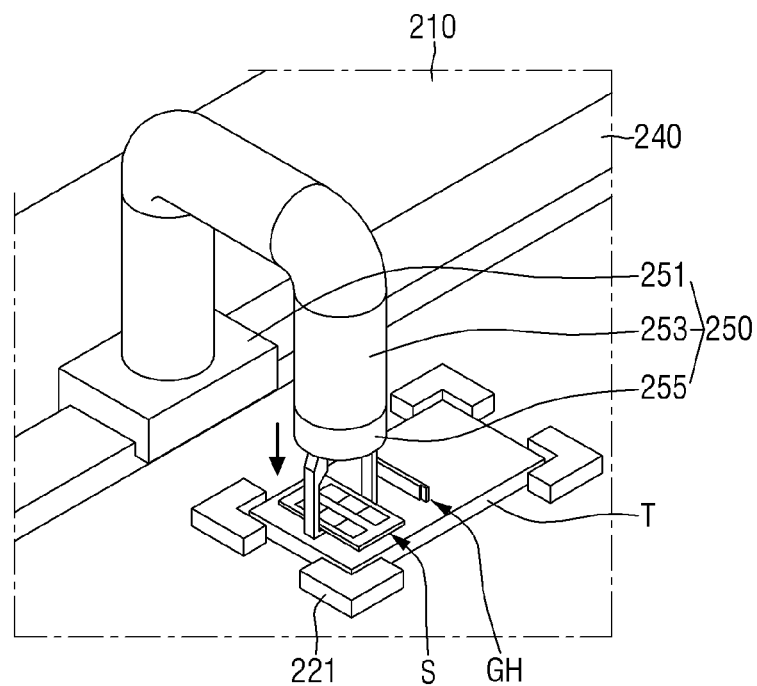
FIG. 23 is a diagram illustrating the step S230 of FIG. 20.

FIG. 23 is a diagram illustrating the step S230 of FIG. 20.

Referring to FIG. 23, the stub S may be conveyed to the tray T (S230). The working robot 250 may move to a position adjacent to the shuttle port 230. Next, the working robot 250 grasps the stub S fixed to the shuttle port 230. The working robot 250 may move to a position adjacent to the tray port 220, while grasping the stub S. The working robot 250 may place the grasped stub S on the tray T fixed to the tray port 220.

Although it has been shown that the grid holder GH is conveyed first and then the stub S is conveyed, embodiments are not limited thereto. For example, the stub S may be conveyed first, and then the grid holder GH may be conveyed after conveying the stub S.

Figure 24:
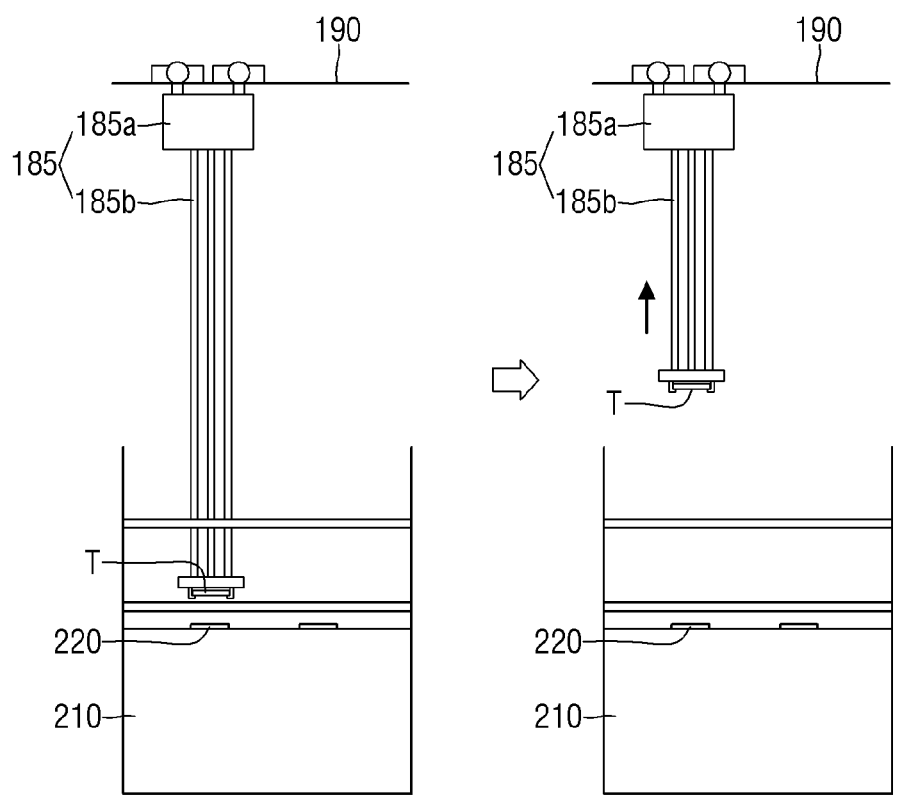
FIG. 24 is a diagram illustrating the step S240 of FIG. 20.

FIG. 24 is a diagram illustrating the step S240 of FIG. 20.

Referring to FIG. 24, the tray T may be unloaded from the tray port 220 (S240). The OHT hand 185b of the tray transfer module 185 may descend in the vertical direction. The OHT hand 185b may grasp the tray T. Subsequently, the OHT hand 185b may ascend in the vertical direction. The tray T may be stored in the OHT 185a.

Figure 25:
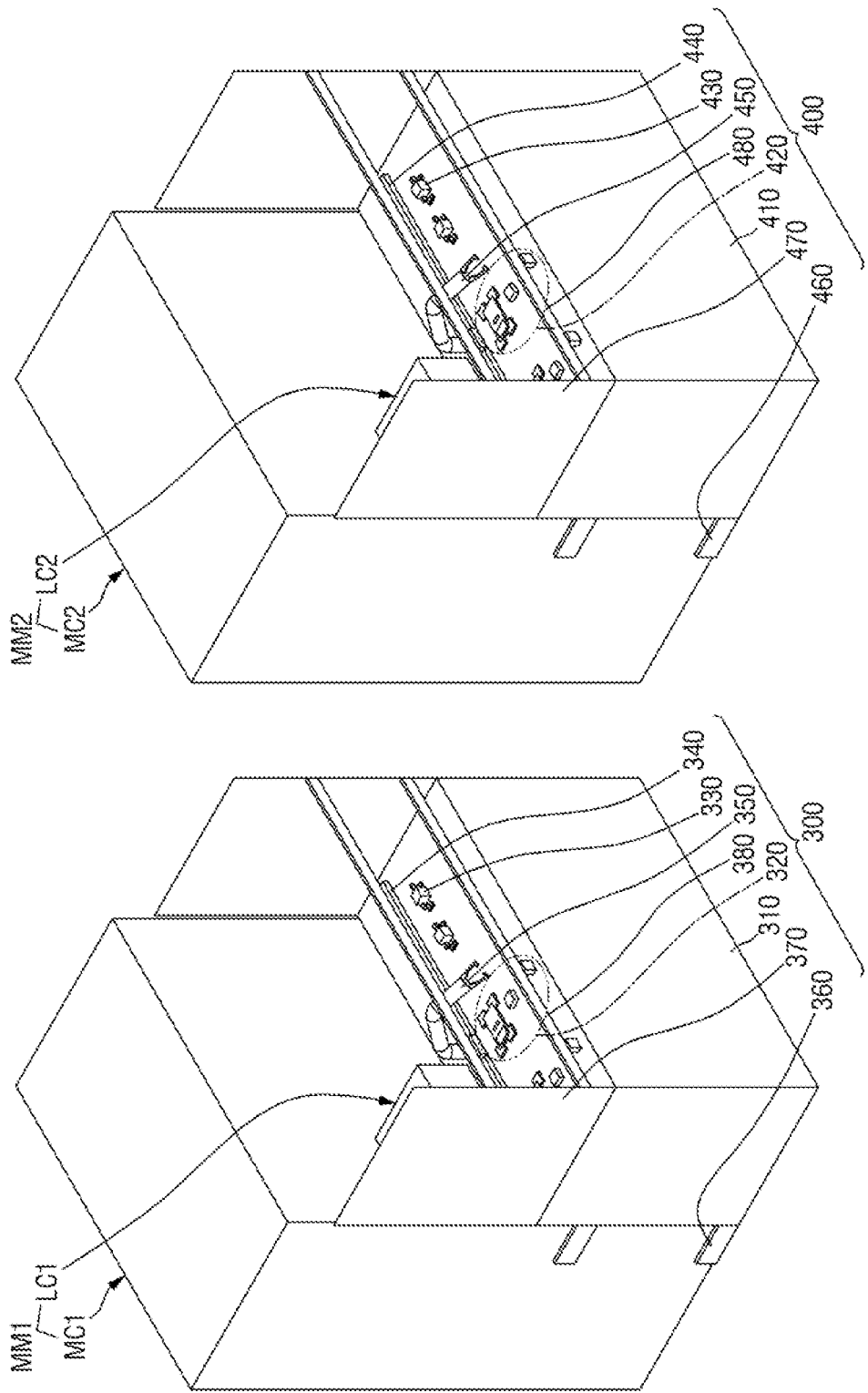
FIG. 25 is a perspective view illustrating the destructive analysis automation apparatus according to embodiments.

FIG. 25 is a perspective view illustrating the destructive analysis automation apparatus according to embodiments. Hereinafter, the destructive analysis automation apparatus including a plurality of main modules and an operating method thereof will be described referring to FIG. 25.

Referring to FIG. 25, the destructive analysis automation apparatus according to embodiments may include a first main module MM1, a second main module MM2, a first EFEM 300, and a second EFEM 400.

The first main module MM1 and the second main module MM2 may be installed inside the analysis chamber 2000. Each of the first main module MM1 and the second main module MM2 may be one of the pre-processing module 140, the sample fabrication module 150, and the analysis module 160. Hereinafter, for convenience of explanation, the first main module MM1 will be described as the pre-processing module 140, and the second main module MM2 will be described as the sample fabrication module 150.

The first EFEM 300 may be installed on one side of the first main module MM1. The first EFEM 300 may be coupled to the first main module MM1. The first EFEM 300 may be coupled to the first main module MM1, using the first fastening unit 360 of the first EFEM 300.

The second EFEM 400 may be installed on one side of the second main module MM2. The second EFEM 400 may be coupled with the second main module MM2. The second EFEM 400 may be coupled with the second main module MM2, using the second fastening unit 460 of the second EFEM 400.

The first EFEM 300 includes a first base module 310, a first tray port 320, a first shuttle port 330, a first robot transfer rail 340, a first working robot 350, a first fastening unit 360, a first screen fence 370, and a first protection bar 380. The second EFEM 400 includes a second base module 410, a second tray port 420, a second shuttle port 430, a second robot transfer rail 440, a second working robot 450, a second fastening unit 460, a second screen fence 470, and a second protection bar 480. Since the first EFEM 300 and the second EFEM 400 may be the same as the EFEM 200 described using FIGS. 3 to 8, detailed description thereof will not be provided.

The tray T is loaded into the first EFEM 300. The tray T is loaded into the first tray port 320. The stub S and the grid holder GH of the tray T are each conveyed to the first shuttle port 330. The first working robot 350 conveys the stub S and the grid holder GH to the first shuttle port 330. At this time, the test wafer piece may not be stored in the stub S. The test sample may not be stored in the grid holder GH.

The first working robot 350 loads the first shuttle port 330 into the first load lock chamber LC1 of the first main module MM1. Next, the first shuttle port 330 is loaded into the first main chamber MC1. The pre-processing work is performed inside the first main chamber MC1. The pre-processing work is performed to form the test wafer pieces. The test wafer pieces are stored in the stub S. The stub S is fixed to the first shuttle port 330 again.

Subsequently, the first shuttle port 330 is unloaded from the first load lock chamber LC1. The first working robot 350 conveys the first shuttle port 330 including the stub S in which the test wafer pieces are stored to the first base module 310. The first working robot 350 conveys the stub S and the grid holder GH fixed to the first shuttle port 330 to the tray T. At this time, the test wafer pieces are stored in the stub S, but the test sample is not stored in the grid holder GH.

The tray T is unloaded from the first tray port 320. The tray T may be conveyed by the tray transfer module 185 and loaded into the second tray port 420 of the second EFEM 400.

The second working robot 450 may convey the stub S and the grid holder GH stored in the tray T fixed to the second tray port 420 to the second shuttle port 430. At this time, the test wafer pieces may be stored in the stub S, and the test sample may not be stored in the grid holder GH. The second working robot 450 may load the second shuttle port 430, to which the stub S and the grid holder GH are fixed, into the second main module MM2. The second working robot 450 grasps the second shuttle port 430 and loads it into the second load lock chamber LC2.

The second shuttle port 430 is loaded into the second main chamber MC2 via the second load lock chamber LC2. The sample fabrication work may be performed inside the second main chamber MC2. The test sample may be fabricated by performing the sample fabrication work. The test sample may be fabricated by cutting the test wafer piece. The fabricated test sample may be stored in the grid holder GH. The test wafer pieces that remain after fabrication of the test sample are stored in the stub S again. The grid holder GH in which the test sample is stored and the stub S in which the test wafer pieces are stored are fixed to the second shuttle port 430 again.

The second shuttle port 430 is then unloaded from the second load lock chamber LC2. The second working robot 450 grasps the second shuttle port 430 and conveys it to the second base module 410. The second working robot 450 grasps the grid holder GH and the stub S, and conveys the grid holder GH and the stub S to the tray T fixed to the second tray port 420. Next, the tray T may be unloaded from the second EFEM 400.

Information about the tray T may be stored in the tray ID. The test wafer pieces fixed to the stub S and the test sample fixed to the grid holder GH may be stored in the stub ID and the grid ID, respectively. The IDs may be reported to the central module 195 by a computer. The central module 195 may track and control the progress of the semiconductor destructive analysis work, using each ID.

While example embodiments have been described with reference to the figures, it will be understood by those of ordinary skill in the art that various changes in form and details may be made therein without departing from the spirit and scope as defined by the following claims and their equivalents.

What is claimed is:

1. An equipment front end module (EFEM) comprising:
   a base configured to communicate with a processor;
   a tray port on the base, the tray port being configured to load a tray comprising a stub and a grid holder;

a working robot configured to move in a direction on the base, and grasp and convey the stub in the tray and the grid holder in the tray; and a shuttle port on the base, the shuttle port comprising a first groove configured to fix the stub, and a second groove configured to fix the grid holder, wherein the working robot is further configured to convey the stub to the first groove and convey the grid holder to the second groove.

2. The EFEM of claim 1, wherein the working robot is configured to load the shuttle port into a main device and unload the shuttle port from the main device.

3. The EFEM of claim 1, wherein the shuttle port comprises:

a first fixing unit, on a first side of the shuttle port, configured to fix the stub; and a second fixing unit, on a second side of the shuttle port, configured to fix the grid holder.

4. The EFEM of claim 1, further comprising at least two or more tray ports comprising the tray port and at least two or more shuttle ports comprising the shuttle port.

5. The EFEM of claim 1, wherein the stub is configured to store test wafer pieces, and wherein the grid holder is configured to store a test sample.

6. The EFEM of claim 5, wherein the test wafer pieces and the test sample are each stored in different IDs, and wherein the processor is configured to trace the test wafer pieces and the test sample.

7. The EFEM of claim 1, wherein the tray comprises a tray ID comprising information about the tray, and wherein the tray port comprises an ID reader configured to read the tray ID, and a sensor configured to communicate with the processor.

8. The EFEM of claim 7, wherein the base is configured to communicate with the processor to control the working robot.

9. The EFEM of claim 7, wherein the processor is configured to control and track the tray ID.

10. A destructive analysis automation apparatus comprising:

a main device configured to perform a semiconductor destructive analysis; and an equipment front end module (EFEM) which is connected to a side of the main device, wherein the EFEM comprises:

a tray port configured to load a tray comprising a stub and a grid holder;

a shuttle port configured to fix the stub and the grid holder, the shuttle port being loaded in the main device; and a working robot configured to convey the stub, the grid holder, and the shuttle port, wherein the working robot is further configured to grasp the stub in the tray and the grid holder in the tray and convey the stub and the grid holder to the shuttle port, and wherein the working robot is further configured to grasp the shuttle port and loads the shuttle port into the main device.

11. The destructive analysis automation apparatus of claim 10, wherein the main device comprises a load lock chamber into which the shuttle port is loaded and unloaded.

12. The destructive analysis automation apparatus of claim 10, wherein the EFEM comprises a fastening unit connected to the main device.

13. The destructive analysis automation apparatus of claim 10, further comprising a tray transfer device configured to convey the tray, wherein the tray transfer device is further configured to load and unload the tray into and from the tray port.

14. The destructive analysis automation apparatus of claim 10, wherein the main device comprises a first main device configured to perform a pre-processing process, and a second main device configured to perform a sample fabrication process.

15. The destructive analysis automation apparatus of claim 10, wherein the tray comprises a tray ID comprising information about the tray, and wherein the tray port comprises an ID reader configured to read the tray ID and a sensor configured to communicate with a processor.

16. The destructive analysis automation apparatus of claim 10, wherein the stub is configured to store test wafer pieces, and wherein the grid holder is configured to store a test sample.

17. The destructive analysis automation apparatus of claim 16, wherein the test wafer pieces and the test sample are respectively stored in different IDs and traceable.

18. A destructive analysis automation apparatus comprising:

a first main device configured to perform a pre-processing to form test wafer pieces and store the test wafer pieces in a stub;

a second main device configured to perform a sample fabrication to fabricate a test sample and store the test sample in a grid holder;

a first equipment front end module (EFEM) on a side of the first main device; and a second EFEM provided on a side of the second main device, wherein the first EFEM comprises:

a first tray port configured to load a tray comprising the stub;

a first shuttle port configured to fix the stub; and a first working robot configured to convey the stub from the tray to the first shuttle port and convey the first shuttle port to the first main device, and wherein the second EFEM comprises:

a second tray port configured to load a tray comprising the grid holder;

a second shuttle port configured to fix the grid holder; and a second working robot configured to convey the grid holder from the tray to the second shuttle port, and convey the second shuttle port to the second main device.

19. The destructive analysis automation apparatus of claim 18, further comprising a tray transfer device configured to convey the tray, wherein the tray transfer device is further configured to load and unload the tray into and from the first tray port and the second tray port.

20. The destructive analysis automation apparatus of claim 18, wherein the tray comprises a tray ID comprising information about the tray, and wherein each of the first tray port and the second tray port comprises an ID reader configured to read the tray ID, and a sensor configured to communicate with a processor.

* * * * *